United States Patent
Rankin et al.

(10) Patent No.: US 7,247,885 B2
(45) Date of Patent: Jul. 24, 2007

(54) CARRIER CONFINEMENT IN LIGHT-EMITTING GROUP IV SEMICONDUCTOR DEVICES

(75) Inventors: Glenn H. Rankin, Menlo Park, CA (US); Sandeep R. Bahl, Palo Alto, CA (US)

(73) Assignee: Avago Technologies General IP (Singapore) Ltd. Pte., Singapore (SG)

( * ) Notice: Subject to any disclaimer, the term of this patent is extended or adjusted under 35 U.S.C. 154(b) by 0 days.

(21) Appl. No.: 11/137,939

(22) Filed: May 26, 2005

(65) Prior Publication Data

US 2006/0270086 A1 Nov. 30, 2006

(51) Int. Cl.
*H01L 27/15* (2006.01)
(52) U.S. Cl. .................. 257/87; 257/86; 257/E33.015
(58) Field of Classification Search .............. 257/86, 257/87
See application file for complete search history.

(56) References Cited

U.S. PATENT DOCUMENTS

| | | | |
|---|---|---|---|
| 5,012,304 A | | 4/1991 | Kash et al. |
| 5,729,563 A | * | 3/1998 | Wang et al. .............. 372/50.23 |
| 6,030,266 A | | 2/2000 | Ida et al. |
| 6,872,641 B1 | | 3/2005 | Chidambarrao et al. |
| 2003/0150376 A1 | | 8/2003 | Homewood et al. |
| 2005/0017251 A1 | * | 1/2005 | Vinciguerra et al. .......... 257/79 |

FOREIGN PATENT DOCUMENTS

JP 2000-357818 * 12/2000

OTHER PUBLICATIONS

Kevin P. Homewood et al., "Light from Si via dislocation loops," Materials Today, pp. 34-39 (Jan. 2005).
G.Z. Pan et al., "(113) Defect-Engineered Silicon Light-Emitting Diodes," IEDM Tech Digest, pp. 343-346, Dec. (2004).
M. Kittler et al., "Silicon-based light emission after ion implantation," Optoelectronic Integration on Silicon edited by David J. Robbins et al., Proc. of SPIE vol. 5357, Jul. 2004, pp. 164-171.
M. Milosavlijevic et al., "Engineering of boron-induced dislocation loops for efficient room-temperature silicon light-emitting diodes," Journal of Applied Physics, vol. 97 (2005).
Z. Yu et al., "GaAs-based heterostructures on Silicon," 2005 Int'l Conf. on Compund Semiconductor Mfg New Orleans, LA (Apr. 11-14, 2005).

(Continued)

*Primary Examiner*—B. William Baumeister

(57) ABSTRACT

In one aspect, a first region that includes a first Group IV semiconductor that has a bandgap and is doped with a first dopant of a first electrical conductivity type is formed. A pattern is created. The pattern controls formation of local crystal modifications in the first Group IV semiconductor in an array. An array of local crystal modifications is formed in the first Group IV semiconductor in accordance with the pattern. The local crystal modifications induce overlapping strain fields that increase the bandgap of the first Group IV semiconductor, create an energy band barrier against transport of minority carriers across the first region. A second region that includes a second Group IV semiconductor that has a bandgap and is doped with a second dopant of a second electrical conductivity type opposite the first conductivity type is formed. Semiconductor devices formed in accordance with this method also are described.

25 Claims, 10 Drawing Sheets

OTHER PUBLICATIONS

M.A. Lourenco et al., "Ion beam fabricated silicon light emitting diodes," Phys. Stat. Sol. (a), vol. 201, No. 2 pp. 239-244 (2004).

Maria Eloisa Castagna et al., "High efficiency light emitting devices in silicon," Materials Science & Engineering B, vol. 105, Elsevier, pp. 83-90 (2003).

Regina Ragan et al., "Direct energy gap group IV semiconductor alloys and quantum dot arrays in SnxGe1-x/Ge and SnxSi1-x/Si alloy systems," Materials Science & Engineering B, vol. 87, Elsevier, pp. 2-4-213 (2001).

T. Brunhes et al., "Electroluminescence of Ge/Si self-assembled quantum dots grown by chemical vapor deposition," Applied Physics Letters, vol. 77, No. 12, pp. 1822-1824 (Sep. 18, 2000).

Philippe M. Fauchet et al., "Progress toward nanoscale silicon light emitters," IEEE J. of Selected Topics in Quantum Electronics, vol. 4, No. 6, pp. 1020-1028 (Nov.-Dec. 1998).

C. S. Peng et al., "Optical properties of Ge self-organized quantum dots in Si," Phys. Rev. B, vol. 57, No. 15, pp. 8805-8808 (1998).

G.T. Reed et al., "Erbium-doped silicon and porous silicon for optoelectronics," Materials Science & Engineering B, vol. 40, pp. 207-215 (1996).

* cited by examiner

CARRIER CONFINEMENT IN LIGHT-EMITTING GROUP IV SEMICONDUCTOR DEVICES

BACKGROUND

Group IV semiconductors, such as silicon, germanium, and their alloys, have indirect energy bandgaps, which inhibit band-to-band radiative recombination of electrons and holes. As a result, the predominant recombination mechanism for holes and electrons in these types of semiconductors typically is non-radiative recombination at, for example, defect sites in bulk regions and at surfaces. For this reason, most devices that are formed of these types of semiconductors are inefficient emitters of light.

Silicon is the semiconductor of choice for fabricating electronic devices. It is inexpensive to work with and has a native oxide that provides superior performance and readily may be incorporated in electronic devices wherever it is needed. The significant advantages of using silicon to fabricate electronic devices have spurred many efforts to integrate light emitting devices with silicon electronics.

One approach for integrating light emitting devices with silicon involves forming light-emitting devices from direct bandgap compound semiconductors that are grown on silicon substrates. This approach, however, is not compatible with most silicon device fabrication processes (e.g., CMOS fabrication processes) due to the different thermal requirements of these processes and the processes that are used to fabricate compound semiconductor devices. This approach also may be cost-prohibitive.

Other approaches for integrating light emitting devices with silicon have focused on improving the emission efficiency of silicon. Among the approaches that have shown some promise in this regard are: use of silicon nanostructures, such as porous silicon, to form electroluminescent devices; use of silicon doped with rare-earth metals, such as erbium and cerium, which exhibit luminescent transitions in silicon and porous silicon; use of dislocations that increase the silicon bandgap by introducing local tensile strain to prevent electrons from reaching non-radiative defect sites; and the incorporation of erbium-doped silicon nanocrystals into a silicon dioxide matrix to achieve radiative recombination of carriers with reduced problems from thermal quenching, which is typical of erbium-doping in bulk silicon.

The above-described approaches have demonstrated some success in generating light from silicon devices. The light-emission efficiencies achieved by these approaches, however, are typically insufficient to displace compound semiconductors in optoelectronics applications.

SUMMARY

In accordance with the invention, Group IV semiconductor devices and methods of fabricating the same are featured. In accordance with the invention Group IV semiconductor devices having improved spatial confinement of carriers away from non-radiative recombination defect sites, such as surface states and bulk defects, and having improved crystal structures as a result of improved gettering of deleterious impurities during fabrication are enabled.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The Group IV semiconductor device embodiments in accordance with the invention that are described in detail below enable improved spatial confinement of carriers away from non-radiative recombination defect sites, such as surface states and bulk defects, and allow improved gettering of deleterious impurities. In this way, these embodiments improve the radiative recombination efficiency of Group IV semiconductor devices while additionally reducing both hole and electron leakage in these types of semiconductor devices. The carriers are confined spatially by strain fields that are induced by local crystal modifications. In addition, in some embodiments in accordance with the invention, the process of forming the local crystal modifications improves the crystal quality of the Group IV semiconductor. In some embodiments, the positions of the local crystal modifications are reliably and flexibly controlled with lithographic precision. In this way, these embodiments increase the reproducibility, the reliability, and the flexibility with which light-emitting Group IV semiconductor devices can be fabricated.

Figure 1:
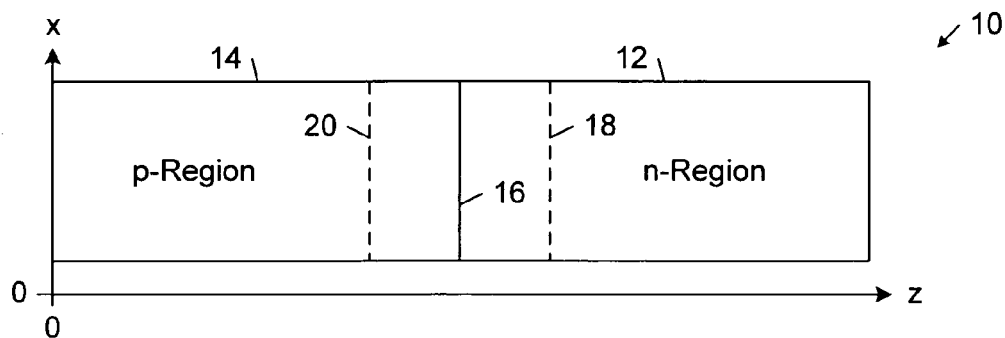
FIG. 1 is a diagrammatic view of an embodiment in accordance with the invention of a semiconductor device.

FIG. 1 shows an embodiment in accordance with the invention of a semiconductor device 10 that includes an n-region 12 and a p-region 14, which are separated by a metallurgical junction 16. The n-region 12 is formed of a first Group IV semiconductor that is doped with an n-type dopant (i.e., donors) and the p-region 14 is formed of a second Group IV semiconductor that is doped with a p-type dopant (i.e., acceptors). At the metallurgical junction 16 the concentration of acceptors is the same as the concentration of donors.

The first and second Group IV semiconductors may be the same or they may be different. The compositions of the first and second Group IV semiconductors may be elemental semiconductors or they may be compound semiconductors. Each of the first and second Group IV semiconductors typically includes at least one of silicon and germanium. In exemplary embodiments, each of the first and second Group IV semiconductors is one of Si, Ge, SiGe, $C_xSi_{1-x}$, $Sn_xGe_{1-x}$, $Sn_xSi_{1-x}$, $(C_xGe_{1-x})_ySi_{1-y}$, and $(C_xSn_{1-x})_ySi_{1-y}$ where $0<x$, $y<1$.

Figure 2A:
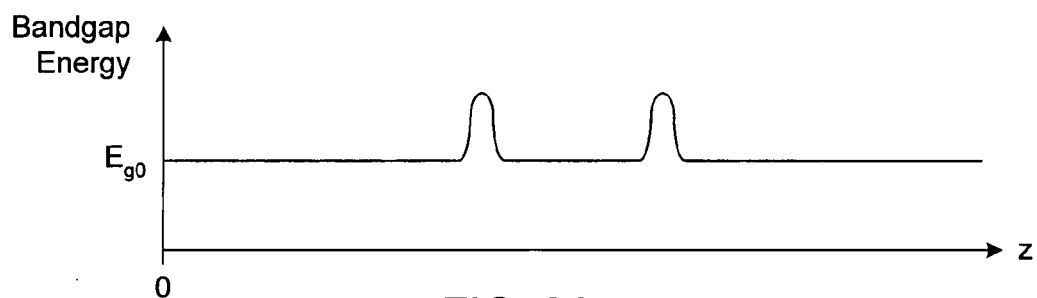
FIG. 2A is a graph of bandgap energy plotted as a function of vertical position through the semiconductor device in accordance with the invention shown in FIG. 1.

The first and second Group IV semiconductors have respective bandgaps corresponding to forbidden energy levels separating the valence band ($E_V$) and the conduction band ($E_C$). At least one of the n-region 12 and the p-region 14 includes a region of local crystal modifications (LCMs) that induces localized strain that increases the bandgap of the corresponding Group IV semiconductor. In the embodiment shown in FIG. 1, the n-region 12 includes a first LCM region 18 and the p-region 14 includes a second LCM region 20. As used herein, the term "local crystal modification" refers to any structure or defect or dislocation in the crystal lattice of a Group IV semiconductor that induces in the Group IV semiconductor a strain field that increases the bandgap of the Group IV semiconductor and has a gettering effect on impurities. In the embodiment in accordance with the invention shown in FIG. 1, local crystal modifications are arranged in lateral (e.g., in a plane normal to the vertical z-direction) arrays. The first LCM region 18 induces localized strain that increases the bandgap of the first Group IV semiconductor. The second LCM region 20 induces localized strain that increases the bandgap of the second Group IV semiconductor. The bandgap-increasing effects of the first LCM region 18 and the second LCM region 20 are shown by the peaks in the bandgap energy graph shown in FIG. 2A. As explained in detail below, each of the LCM regions 18, 20 corresponds to a respective array of local crystal modifications in the corresponding Group IV semiconductor. In these embodiments in accordance with the invention, the local crystal modifications induce overlapping strain fields in the corresponding Group IV semiconductor that increase the bandgap of the Group IV semiconductor. In some embodiments in accordance with the invention, the same process that forms the first and second LCM regions 18, 20 also improves the quality of the nearby Group IV semiconductor crystal structure by serving as sinks for deleterious impurities that become mobile during annealing.

Figure 2B:
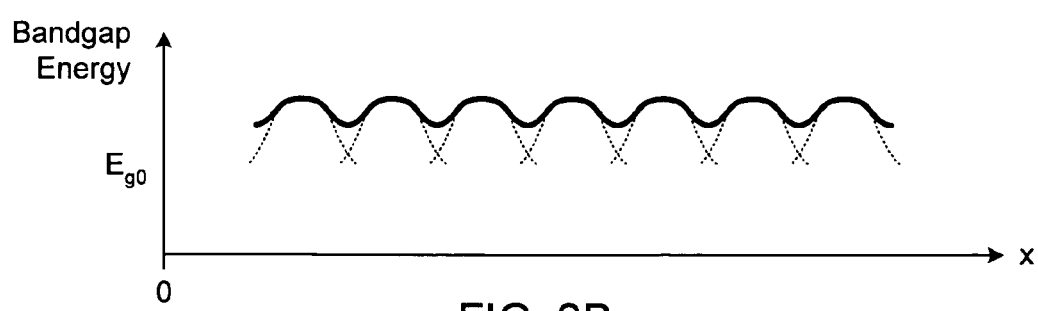
FIG. 2B is a graph of bandgap energy plotted as a function of lateral position across the semiconductor device in accordance with the invention shown in FIG. 1.

FIG. 2B shows the bandgap energy of the second Group IV semiconductor in the p-region 14 in the lateral x-direction along the second LCM region 20. The dashed lines correspond to the overlapping, bandgap-increasing effects of the individual cells of the second array of local crystal modifications 20. The darker, continuous line shows the combined bandgap-increasing effects of entire array along the lateral x-direction.

Figure 3A:
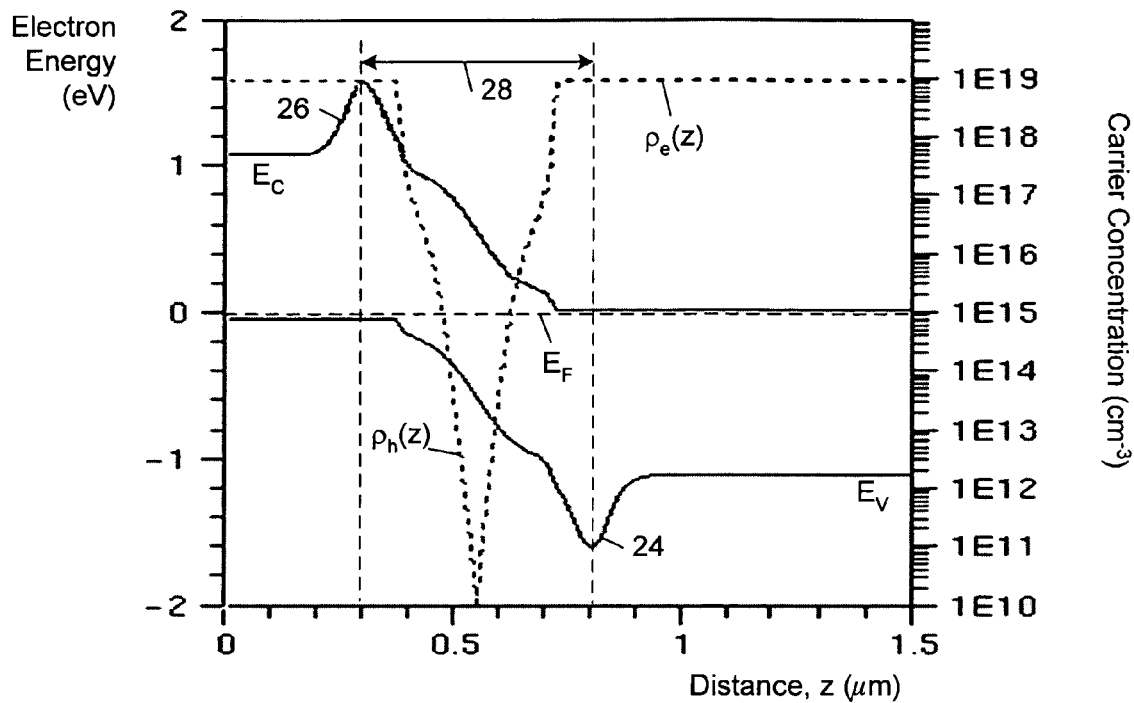
FIG. 3A shows graphs of electron energy and carrier concentration plotted as a function of vertical position through an embodiment in accordance with the invention of the semiconductor device shown in FIG. 1 in thermal equilibrium.
Figure 3B:
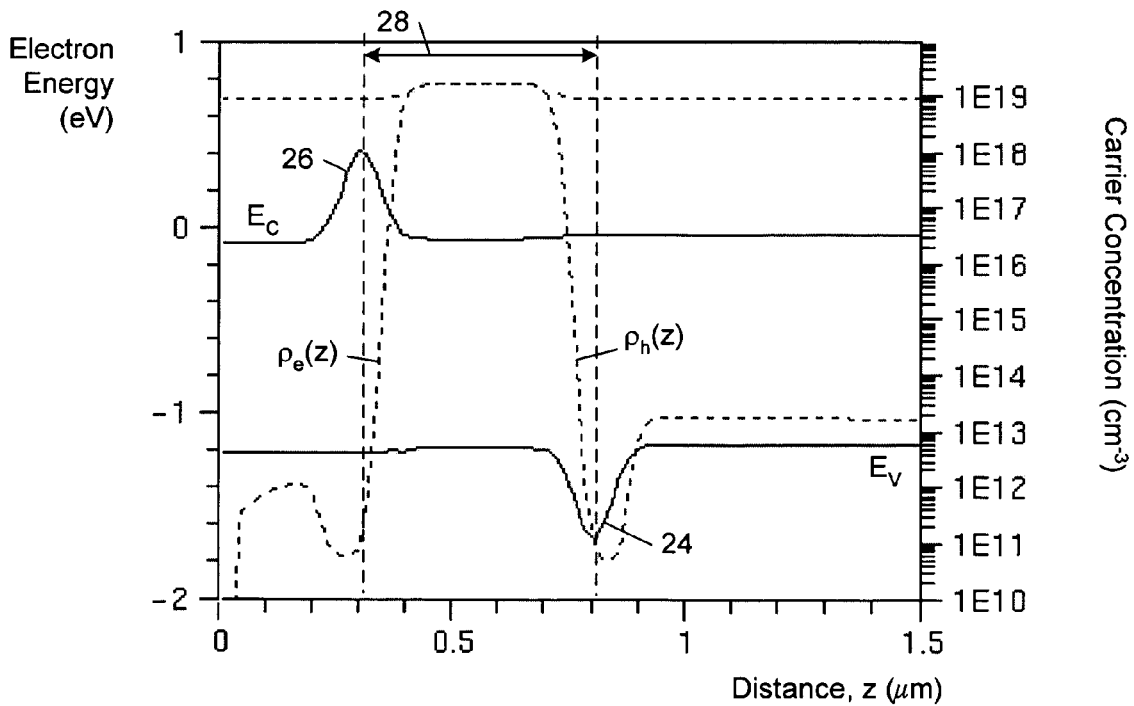
FIG. 3B shows graphs of electron energy and carrier concentration plotted as a function of vertical position through the semiconductor device embodiment in accordance with the invention of FIG. 3A under forward bias.

FIGS. 3A and 3B show a calculated energy band diagram for an embodiment in accordance with the invention of the semiconductor device 10 in thermal equilibrium and under forward bias, respectively. In these embodiments in accordance with the invention, the p-region 14 and the n-region 12 are doped with respective dopant concentrations of $1\times10^{19}$ cm$^{-3}$ through the LCM regions 20, 18 and with respective dopant concentrations of $3\times10^{16}$ cm$^{-3}$ between the LCM regions 20, 18. In the n-region 12, the first LCM region 18 creates an energy barrier 24 in the valence band. In the p-region 14, the second LCM region 20 creates an energy barrier 26 in the conduction band. The region 28 between the energy barriers 24, 26 is referred to herein as a "charge accumulation region". As shown in FIG. 3A the central section of the charge accumulation region 28 is largely depleted in thermal equilibrium as a result of drift and diffusion of holes and electrons between the p-region 14 and the n-region 12. In addition, the n-region 12 and the p-region 14 are moderately to heavily doped (e.g., with dopant concentrations of at least $1\times10^{18}$ cm$^{-3}$) at the locations of the first and second LCM regions 18, 20. This feature ensures that the majority of the bandgap increases that are induced by the hole and second LCM regions 18, 20 are apportioned to the valence band and the conduction band, respectively. This feature also increases the efficiency of the semiconductor device 10 by reducing minority carrier current losses across the energy barriers 24, 26.

Figure 4:
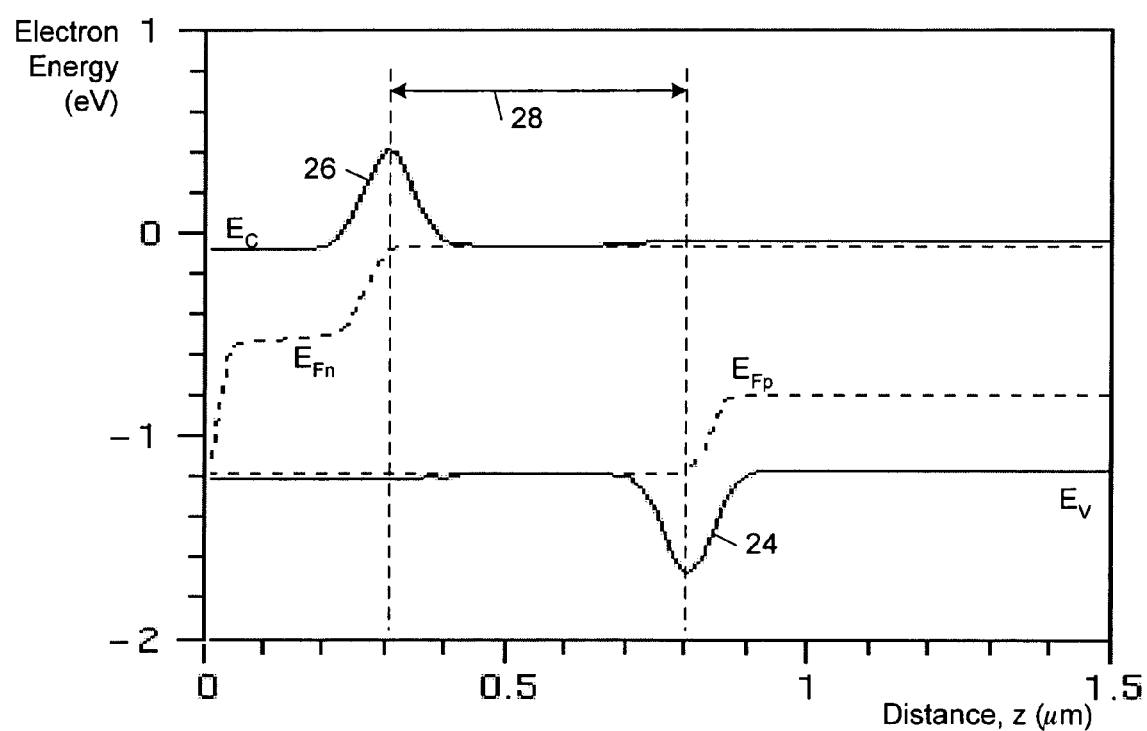
FIG. 4 is a graph of electron energy plotted as a function of vertical position through the semiconductor device in accordance with the invention of FIG. 3A under forward bias.
Figure 5:
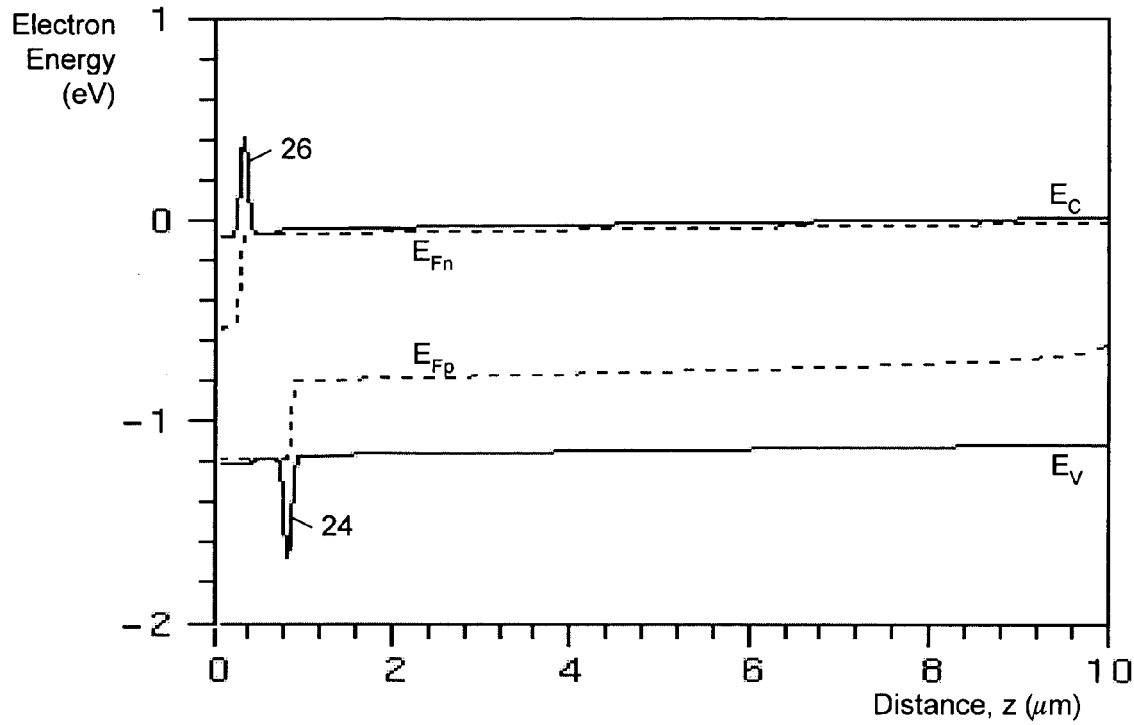
FIG. 5 is a graph of electron energy plotted as a function of vertical position through the semiconductor device in accordance with the invention of FIG. 3A under forward bias.

FIGS. 4 and 5 show an energy band diagram for the semiconductor device 10 under forward bias (i.e., a positive voltage is applied to the p-region 14 relative to the n-region 12) at different vertical scales through the semiconductor device 10. The applied voltage reduces the electrostatic potential across the charge accumulation region 28 and splits the hole and electron quasi-Fermi levels ($E_{Fp}$ and $E_{Fn}$). The applied voltage reduces the drift current relative to the diffusion current and enhances the hole diffusion from the p-region 14 and enhances the electron diffusion from the n-region 12. As a result, holes are injected into the charge accumulation region 28 from the p-region 14 and electrons are injected into the charge accumulation region 28 from the n-region 12. This leads to increases in the hole concentration ($\rho_h(Z)$) and the electron concentration ($\rho_e(Z)$) in the charge accumulation region 28, as shown in FIG. 3B.

The energy barriers 24, 26 spatially confine the injected carriers in the charge accumulation region 28. In particular, the valence band energy barrier 24 restricts the transport of holes from the accumulation region 28 across the n-region 12 and the conduction band energy barrier 26 restricts the transport of electrons from the accumulation region 28 across the p-region 14. The first LCM region 18 and the second LCM region 20 are able to spatially confine the injected carriers in the charge accumulation region 28. The distance separating the first and second LCM regions 18, 20 typically is at least 50 nm (nanometers). In some embodiments, the distance separating the LCM regions 18, 20 ranges from 50 nm to 20 μm (micrometers). In one exemplary embodiment, each of the first LCM region 18 and the second LCM region 20 is located approximately 100 nm from respective edges of the depletion region in thermal equilibrium.

In general, the first LCM region 18 and the second LCM region 20 may include any type of structure or material that induces localized strain that increases the bandgap of the Group IV semiconductors in which they are incorporated. In some embodiments in accordance with the invention, the first LCM region 18 and the second LCM region 20 include the same type of strain-inducing structure/material. In other embodiments in accordance with the invention, the first LCM region 18 and the second LCM region 20 include different types of strain-inducing structures/materials. In some embodiments in accordance with the invention, one or both of the LCM regions 18, 20 may include an array of strain-inducing defects(e.g., isolated interstitials or aggregate structures, such as rod-like defects or dislocation loops), or a layer of epitaxial material inducing strain in the corresponding Group IV semiconductor.

By spatially confining the injected carriers in the charge accumulation region 28, the energy barriers 24, 26 reduce the diffusion of injected holes and electrons to non-radiative recombination sites outside of the charge accumulation region 28. This increases the mean radiative-transition probability in the device and thereby increases the amount of light that is generated from the radiative recombination of electrons and holes in the charge accumulation region 28.

Figure 6:
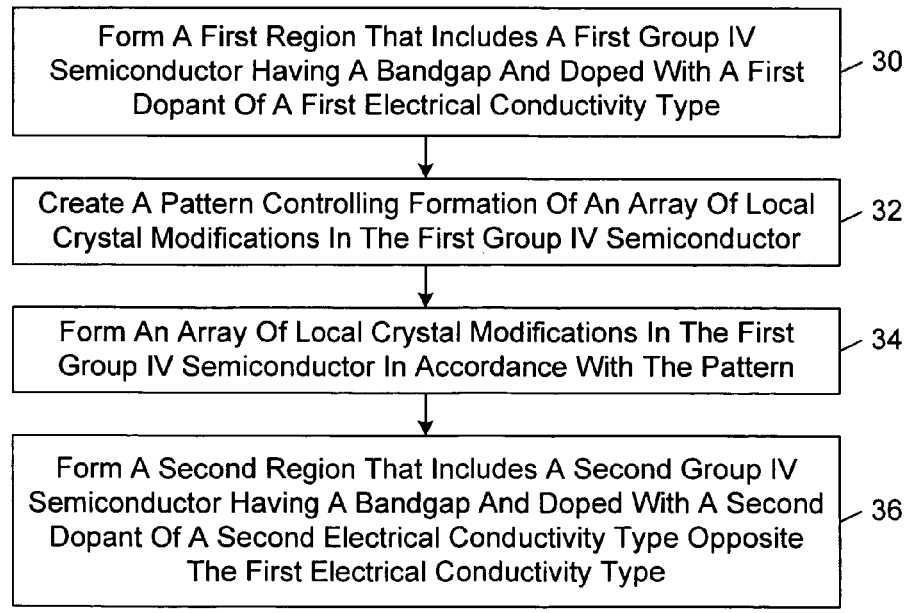
FIG. 6 is a flow diagram of an embodiment in accordance with the invention of a method of fabricating the semiconductor device shown in FIG. 1.

FIG. 6 shows an embodiment in accordance with the invention of a method of fabricating the semiconductor device 10. In general, the process blocks 30-36 may be performed in any order that results in the formation of a semiconductor device of the type shown in FIG. 1 that includes an n-region, a p-region, and at least one of the first and second LCM regions 18, 20. Some embodiments in accordance with the invention additionally include an intrinsic Group IV semiconductor region or lightly-doped Group IV semiconductor region between the n-region 12 and the p-region 14. Depending on the selected fabrication processes, the process blocks 30-36 may be performed in the order shown in FIG. 6 or in a different order.

In accordance with this method, a first region is formed (block 30). The first region includes a first Group IV semiconductor that has a bandgap and is doped with a first dopant of a first electrical conductivity type. In the embodiment in accordance with the invention of the semiconductor device 10 that is shown in FIG. 1, the n-region 12 corresponds to the first region that is formed in block 30.

A pattern is created (block 32). The pattern controls the formation of and array of local crystal modifications in the first Group IV semiconductor. As explained in detail below, the pattern may be any type of extrinsic structure or condition that controls the formation of an array of local crystal modifications in the first Group IV semiconductor. Examples of the pattern include: an implant mask pattern that defines an array of locations for formation of the local crystal modifications; a relief pattern on a surface that promotes formation of the local crystal modifications in an array; a light pattern (e.g., a pattern of ultraviolet light generated by interfering laser beams) that is generated during growth of the local crystal modifications that promotes formation of the local crystal modifications in an array; and a pattern of material created by a system, such as an atomic force microscope.

The pattern is distinguishable from statistically random processes, such as diffusion, implantation and annealing processes, which might result in the formation of an array of local crystal modifications. In particular, the pattern imposes an external structure on the process of forming local crystal modifications in an array, whereas statistically random processes by themselves do not have such a structure. As a result, the pattern increases the precision, the reproducibility, the reliability and the flexibility with which light-emitting Group IV semiconductor device structures may be fabricated relative to processes lacking a pattern-imposed structure.

An array of local crystal modifications is formed in the first Group IV semiconductor in accordance with the pattern (block 34). In the embodiment in accordance with the invention of the semiconductor device 10 that is shown in FIG. 1, the first LCM region 18 corresponds to the array of local crystal modifications that is formed in block 34.

A second region is formed (block 36). The second region includes a second Group IV semiconductor that has a bandgap and is doped with a second dopant of a second electrical conductivity type that is opposite the first electrical conductivity type. In the embodiment in accordance with the invention of the semiconductor device 10 that is shown in FIG. 1, the p-region 14 corresponds to the second region that is formed in block 36.

Depending on the desired semiconductor device structure, an array of local crystal modifications also may be formed in the second region. In some embodiments in accordance with the invention, a respective array of local crystal modifications is formed concurrently in each of the first and second regions during execution of process block 34. In other embodiments in accordance with the invention, the process blocks 32 and 34 are repeated to form the array of local crystal modifications in the second region.

FIGS. 7, 8A, 8B, 9, 10, and 11, show a series of transformations of an intermediate semiconductor device structure 40 into an embodiment in accordance with the invention 42 of the semiconductor device 10.

Figure 7:
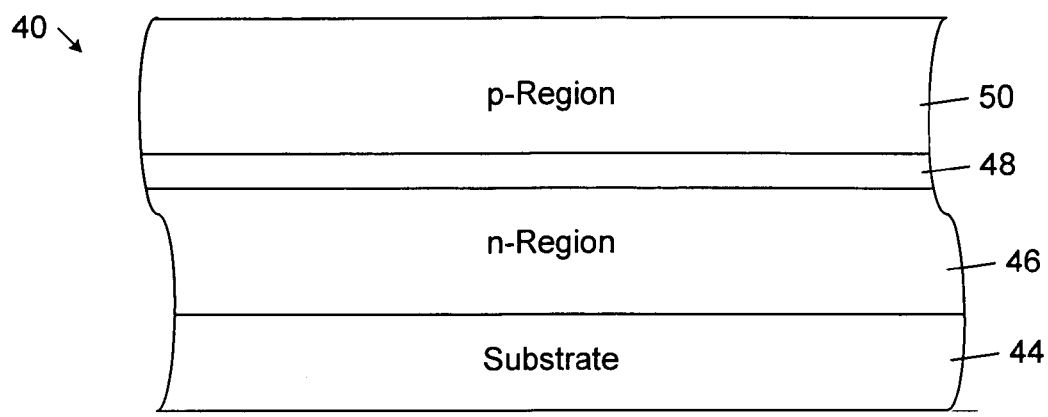
FIG. 7 is a diagrammatic sectional view of and embodiment in accordance with the invention of a semiconductor device structure that includes a substrate, an n-region, an intermediate region, and a p-region.

FIG. 7 shows that the intermediate semiconductor device structure 40 includes a substrate 44, an n-region 46, an intermediate region 48, and a p-region 50. The n-region 46 corresponds to an n-type epitaxial layer that is grown on the substrate 44. As used herein, the term "epitaxial layer" refers to a semiconductor layer having the same crystalline orientation as the substrate on which it is grown. In general, the substrate 44 may be formed of any type of material that supports epitaxial growth of the n-type epitaxial Group IV semiconductor layer. The substrate 44 may be, for example, a Group IV semiconductor substrate. The intermediate region 48 corresponds to an undoped or lightly-doped epitaxial Group IV semiconductor layer that is grown on the n-type epitaxial layer. In general, the intermediate region 48 has a dopant concentration that is less than the dopant concentrations in the n-region 46 and the p-region 50. In the illustrated embodiment in accordance with the invention, the p-region 50 corresponds to a p-type epitaxial layer that is grown on the intrinsic epitaxial layer. In other embodiments in accordance with the invention, the p-region 50 corresponds to a volume of the intermediate epitaxial region 48 that is doped p-type.

Figure 8A:
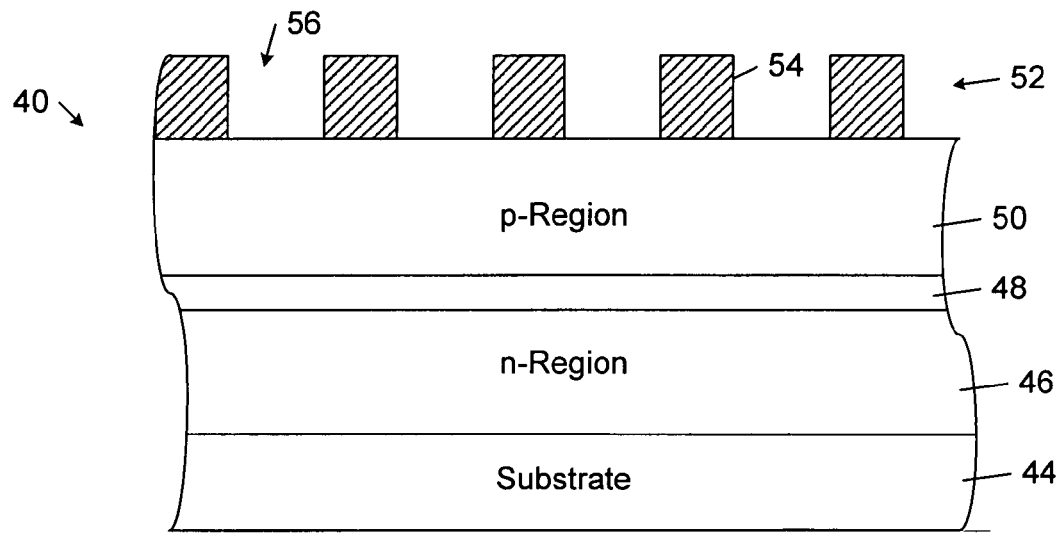
FIG. 8A is a diagrammatic sectional view of a patterned implant mask formed on a surface of the p-region of the device structure in accordance with the invention shown in FIG. 7.
Figure 8B:
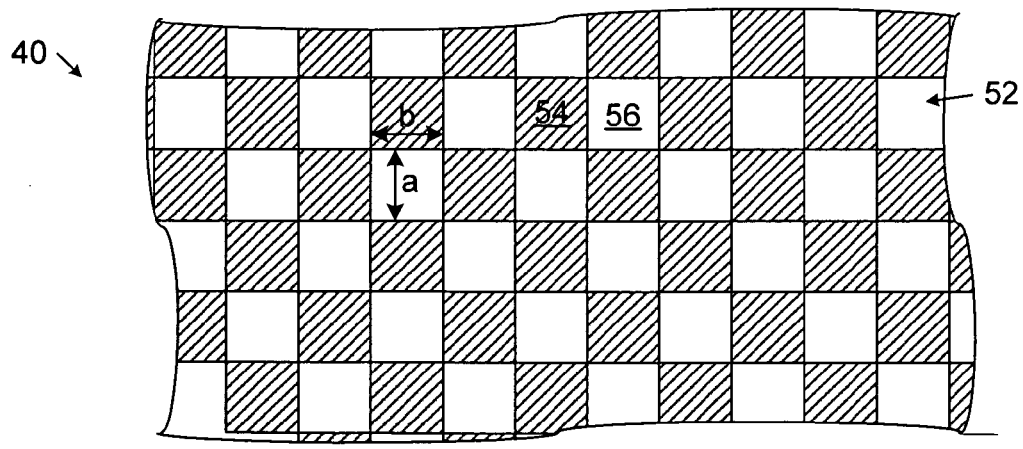
FIG. 8B is a diagrammatic top view of the semiconductor device structure in accordance with the invention shown in FIG. 8A.

FIGS. 8A and 8B respectively show sectional and top views of a patterned implant mask 52 that is formed on a surface of the p-region 50 of the device structure 40. In general, the implant mask 42 defines an array of regions of different implant permeability over an area of the semiconductor device structure 40. For example, in the illustrated embodiment in accordance with the invention, the implant mask 42 includes regions 54 of implant mask material and regions 56 that are free of implant mask material. The regions 54 of implant mask material reduce the ability of implant species to penetrate into the semiconductor device structure 40. In the illustrated embodiment in accordance with the invention, the implant mask 52 defines an array of regions having two different implant permeabilities. In other embodiments in accordance with the invention, the implant mask 52 may define an array of regions having more than two different implant permeabilities.

In the illustrated embodiment in accordance with the invention, the implant mask 52 defines a regular, periodic array of regions 54, 56 in the form of a checkerboard pattern. In the illustrated embodiment in accordance with the invention, the lateral dimensions a, b of the regions 54, 56 are equal (i.e., the regions are square) and the same for each of the regions 54, 56. In other is embodiments in accordance with the invention, the regions 54, 56 may have a non-square shape, such as a rectangular shape, a polygonal shape, a circular shape, and an elliptical shape. In general, the regions 54, 56 have sizes that are selected so that the local crystal modifications that are formed in accordance with the implant mask pattern induce overlapping strain fields. In addition, the sizes of regions 54 and 56 may be selected to influence the regularity of size and arrangement of resulting crystal imperfections. In some embodiments in accordance with the invention the dimensions of the regions 54, 56 preferably are at most 200 nm and, more preferably, are at most 100 nm.

The thickness and material composition of the implant mask material is selected to achieve a target difference between projected ranges of atomic species implanted in the regions 54 of implant mask material and the regions 56 that are free of implant mask material. In some embodiments in accordance with the invention, the implant mask 52 is designed so that the regions 54 of implant material completely block the implantation of atomic species into the semiconductor device structure 40. In general, the implant mask 52 may be formed of any type of material that can be patterned into an array of regions of different implant permeability, including photoresist, silicon dioxide, and silicon nitride.

Figure 9:
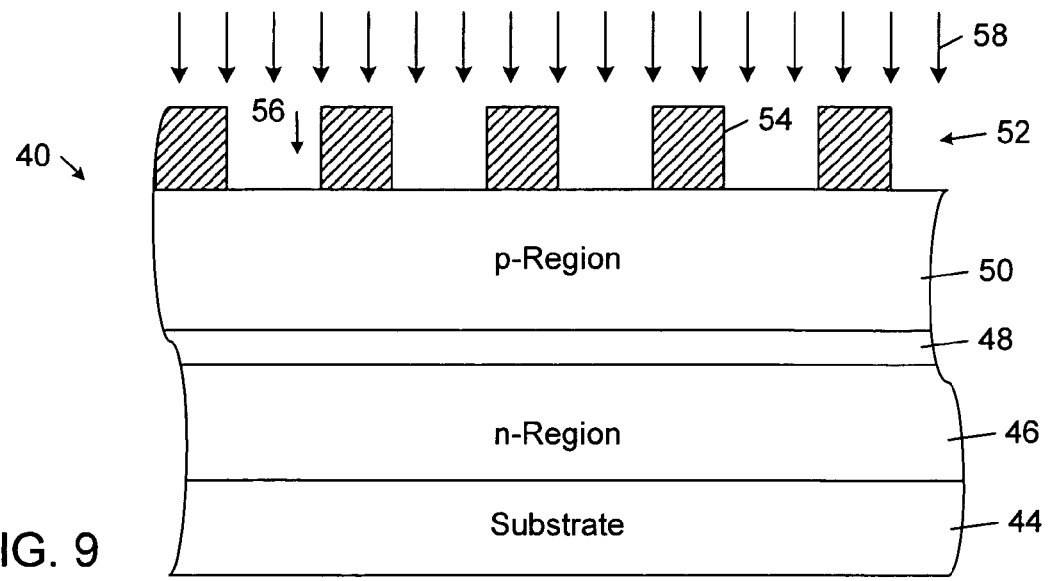
FIG. 9 is a diagrammatic sectional view of an atomic species being implanted into the semiconductor device structure in accordance with the invention shown in FIG. 8A.

FIG. 9 shows an atomic species 58 being implanted into the semiconductor device structure 40 through the implant mask 52. In general, the atomic species 58 is selected-to form in at least one of the n-region 46 and the p-region 50 defects that induce bandgap-increasing strain fields in the corresponding Group IV semiconductors. The atomic species 58 may be a dopant species (e.g., boron for the p-region 50 and arsenic for the n-region) or an electrically neutral, non-dopant species (e.g., a Group IV semiconductor species).

Figure 10:
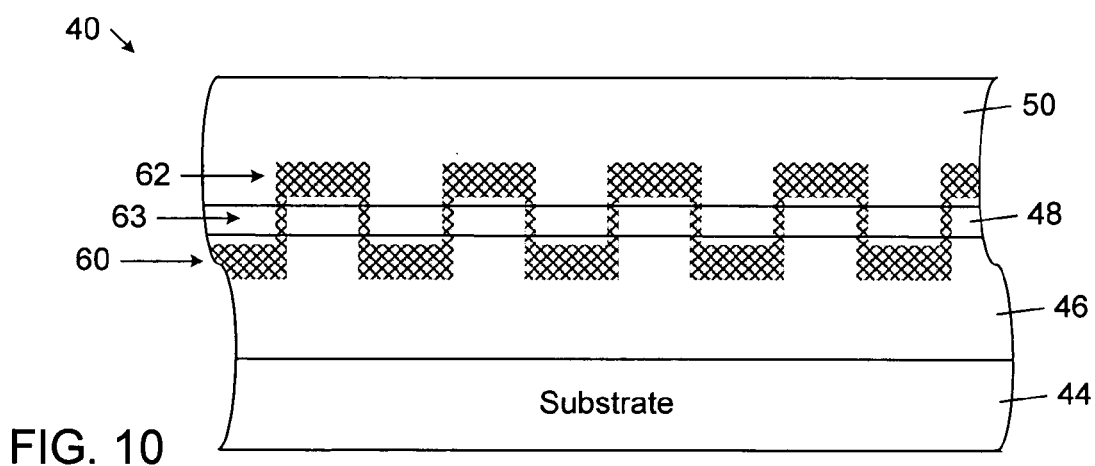
FIG. 10 is a diagrammatic sectional view of atomic species implanted in the semiconductor device structure in accordance with the invention shown in FIG. 9.

FIG. 10 shows the atomic species 58 implanted in the semiconductor device structure 40. After the implantation process, the implant mask 52 is removed and the semiconductor device structure 40 is annealed to activate the implanted atomic species, aggregate interstitial defects, reduce damage to the crystal caused by the implant, and mobilize deleterious impurities in the device so they can move to and be captured by residual defects. The implant parameters (e.g., atomic species, energy, and dosage) and the conditions of the subsequent annealing process (e.g., annealing temperature and time) determine the types of defects that are formed. Among the types of defects that may remain after annealing are isolated interstitials, interstitial clusters, rod-like defects, perfect prismatic dislocation loops, and faulted Frank dislocation loops. In embodiments in accordance with the invention in which the substrate 44, the n-region 46, the intermediate region 48, and the p-region 50 are formed of silicon, the implant parameters and the annealing conditions may be selected to promote the formation of {113} rod-like defects along <110> silicon, which have been observed to produce higher electroluminescence than other types of defects.

In the illustrated embodiment in accordance with the invention, the implantation and annealing processes produce an array 60 of local crystal modifications in the n-region 46, an array 62 of local crystal modifications in the p-region 50; and a third array 63 of spaced-apart crystal modifications between the local crystal modifications in the arrays 60, 62. In this regard, the thickness of the implant mask material, the composition of the implant mask material, and the implant parameters are selected to achieve a first target peak implant concentration in the n-region 46 and a second target peak implant concentration in the p-region 50. In some embodiments in accordance with the invention each of the first and second target peak implant concentrations is at least $1\times10^{18}$ $cm^{-3}$. The distance separating the arrays 60, 62 typically is at least 50 nm (nanometers). In some embodiments in accordance with the invention, the distance separating the arrays 60, 62 ranges from 50 nm to 20 μm (micrometers). In some embodiments in accordance with the invention, the target projected range of the implanted species in the n-region 46 is approximately 100 nm below the bottom edge of the intermediate region 48 and the target projected range of the implanted species in the p-region 50 is approximately 100 nm above the top edge of the intermediate region 48.

Figure 11:
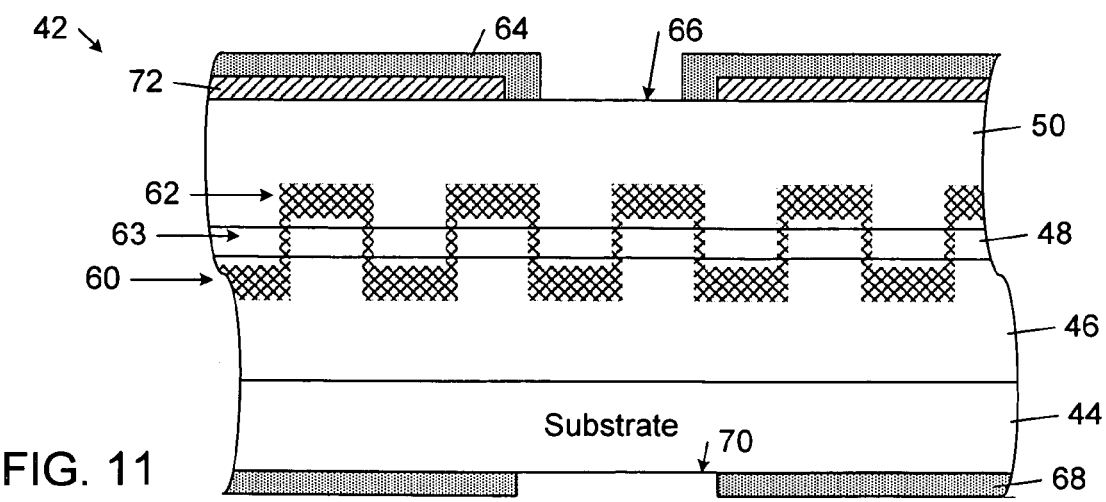
FIG. 11 is a diagrammatic sectional view of top and bottom electrodes formed on the semiconductor device structure in accordance with the invention shown in FIG. 10.

FIG. 11 shows a top ohmic electrical contact 64 on a top surface 66 of the semiconductor device structure 40 and a bottom ohmic electrical contact 68 on a bottom surface 70 of the substrate 44. A portion of the top electrical contact 64 is electrically isolated from the p-region 50 by a layer 72 of electrically insulating material (e.g., silicon dioxide or silicon nitride).

The top electrical contact 64 may connect the p-region 50 to a source of a forward bias and the bottom electrical contact 70 may connect the n-region 46 to ground potential. In response to an applied forward bias, electrons and holes are injected into the accumulation region where they are confined by the first and second arrays 60, 62 of local crystal modifications. The injected carriers recombine in the charge accumulation region. The light that is generated by the recombining holes and electrons may be emitted, for example, through the top surface 66 or the bottom surface 70.

FIGS. 12, 13, 14, 15A 15B, 16, and 17, show a series of transformations of an intermediate semiconductor device structure 80 into an embodiment 82 in accordance with the invention of the semiconductor device 10.

Figure 12:
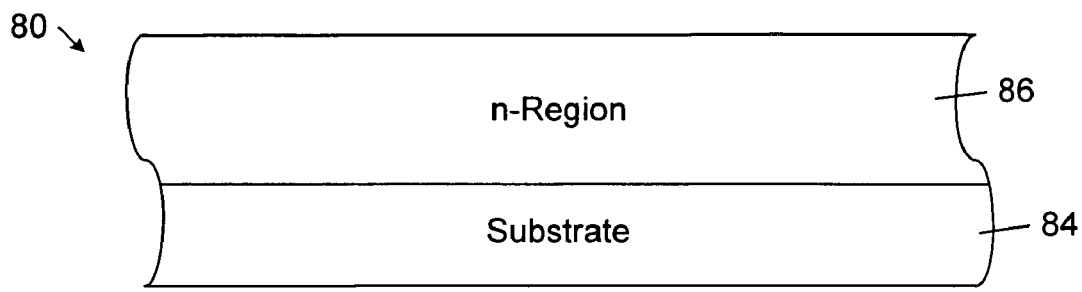
FIG. 12 is a diagrammatic sectional view of an embodiment in accordance with the invention of a semiconductor device structure that includes a substrate and an n-region.

FIG. 12 shows that the intermediate semiconductor device structure 80 includes a substrate 84 and an n-region 86. The n-region 86 corresponds to an n-type epitaxial layer that is grown on the substrate 84. Alternatively, the n-region 86 may be the upper part of an n-doped substrate. In general, the substrate 84 may be formed of any type of material that supports epitaxial growth of the n-type epitaxial Group IV semiconductor layer. The substrate 84 may be, for example, a Group IV semiconductor substrate.

Figure 13:
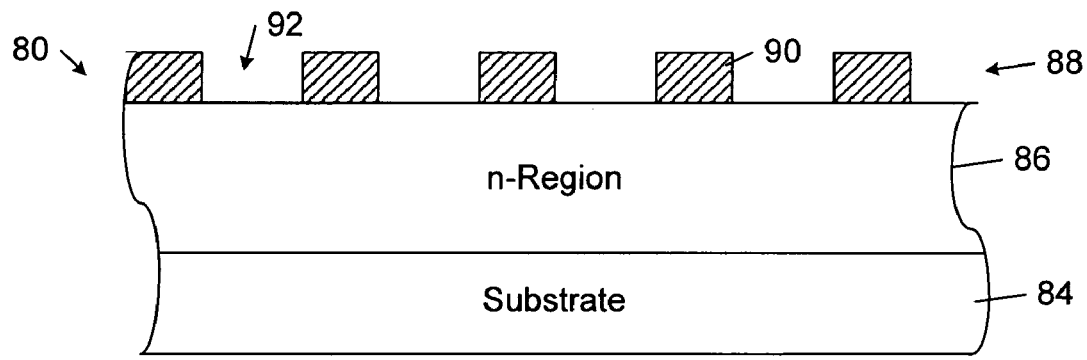
FIG. 13 is a diagrammatic sectional view of a patterned etch mask formed on the semiconductor device structure in accordance with the invention shown in FIG. 12.

FIG. 13 shows a patterned etch mask 88 that is formed on a surface of the n-region 86 of the device structure 80. In general, the etch mask 88 defines an array of regions of different etchability over an area of the semiconductor device structure 80. For example, in the illustrated embodiment, the etch mask 88 includes regions 90 of etch mask material and regions 92 that are free of etch mask material. The regions 90 of etch mask material protect the underlying regions of the semiconductor device structure 80 against etching.

In the illustrated embodiment in accordance with the invention, the etch mask 88 defines a regular, periodic array of regions 90 that are separated by horizontal and vertical regions 92 that are free of etch mask material. In the illustrated embodiment, the lateral dimensions of the etch mask regions 90 are equal (i.e., the regions are square) and the same for each of the regions 90. In other embodiments, the etch mask regions 90 may have a non-square shape, such as a rectangular shape, a polygonal shape, a circular shape, and an elliptical shape. In general, the etch mask regions 90 are sized and spaced so that the local crystal modifications that are formed in accordance with the etch mask pattern induce overlapping strain fields in the Group IV semiconductor in which they are embedded. In some embodiments in accordance with the invention, the lateral dimensions of the etch mask regions 90 and the spacings between adjacent ones of the etch mask regions 90 preferably are at most 200 nm and, more preferably, are at most 100 nm.

Figure 14:
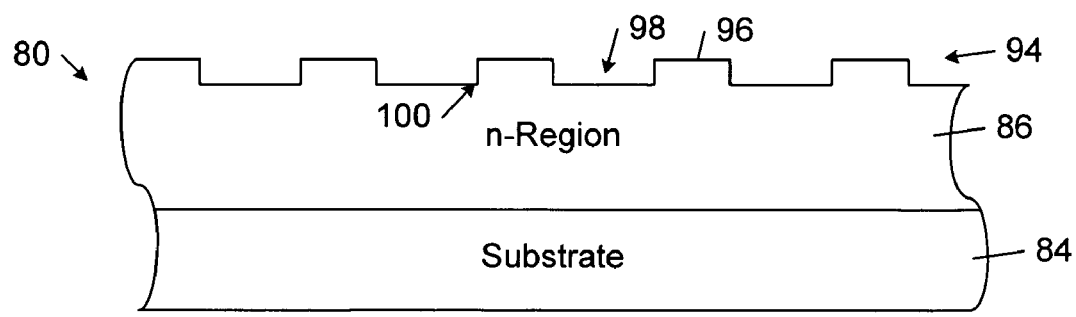
FIG. 14 is a diagrammatic sectional view of a relief pattern etched into the n-region of the semiconductor device structure in accordance with the invention shown in FIG. 13.

FIG. 14 shows a relief pattern 94 that is formed in the exposed surface of the n-region by a selective etching process. In general, any one of a wide variety of different etching processes may be used to form the relief pattern 94, including chemical etching processes and reactive ion etching processes. The relief pattern 94 includes a pattern of features that promotes the formation of an array of local crystal modifications. In the illustrated embodiment in accordance with the invention, the relief pattern 94 includes an array of mesas 96 that are separated by horizontal and vertical channels 98. The corners 100 that are formed at the interfaces between the mesas 96 and the channels 98 have surface energies that promote the surface nucleation of particles, clusters, islands, and/or monolayers of material that may be deposited on the relief pattern 94 depending on the deposition parameters.

Figure 15A:
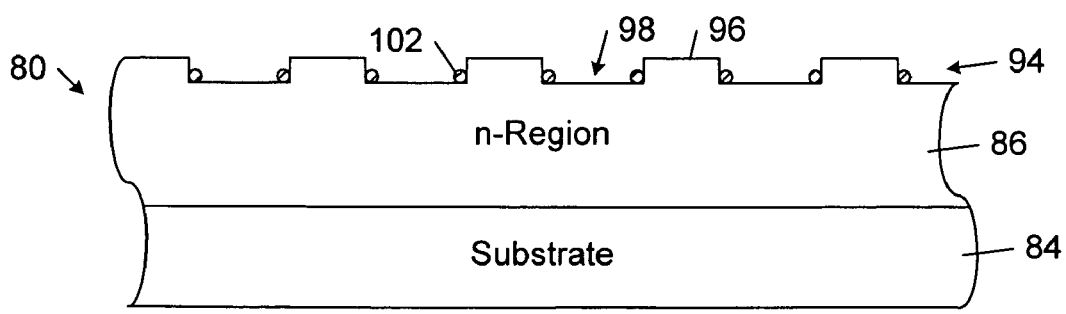
FIG. 15A is a diagrammatic sectional view of a deposited material formed in accordance with the relief pattern on the n-region of the semiconductor device structure in accordance with the invention shown in FIG. 14.
Figure 15B:
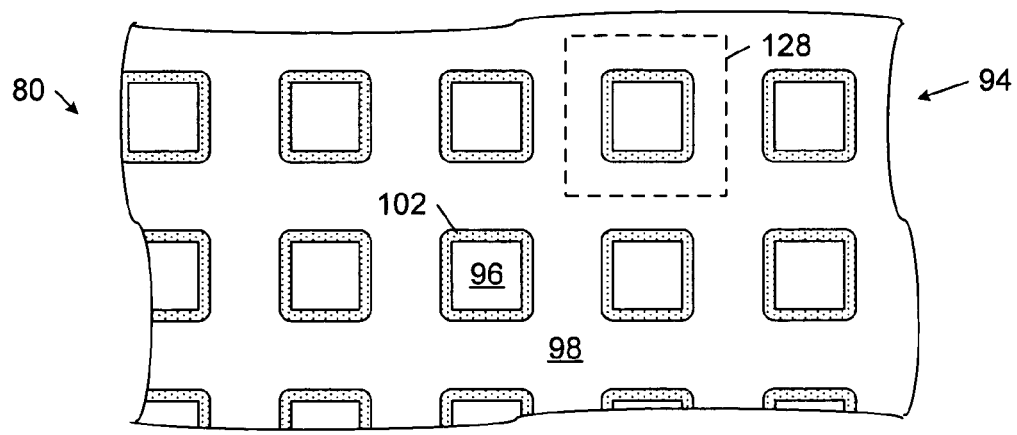
FIG. 15B is a diagrammatic top view of the semiconductor device structure in accordance with the invention shown in FIG. 15A.

FIGS. 15A and 15B respectively show sectional and top views of a material 102 that was deposited on the n-region of the semiconductor device structure in accordance with the relief pattern 94. The material 102 may be deposited any one of a wide variety of different material deposition processes, including chemical vapor deposition and molecular beam epitaxy. The deposition parameters are selected to achieve the formation of an array of particles, clusters, islands, and/or monolayers of material having a size and a composition that induces bandgap-increasing strain fields in the first Group IV semiconductor in the completed n-region 86. The dimensions of the deposited material 102 typically are below the limits for deleterious strain relaxation.

In some embodiments in accordance with the invention, the deposited material 102 is different from the first Group IV semiconductor. In some of these embodiments in accordance with the invention, the constituent atoms of the deposited material are different in size than the constituent atoms of the first Group IV semiconductor. In other ones of these embodiments in accordance with the invention, the constituent atoms of the deposited material have different electronegativities than the constituent atoms of the first Group IV semiconductor. In still other ones of these embodiments in accordance with the invention, the deposited material 102 forms strain layers that respectively induce strain in the completed n-region. In one exemplary embodiment in accordance with the invention, the n-region 86 is formed of silicon and the deposited material includes at least one of carbon and germanium.

Figure 16:
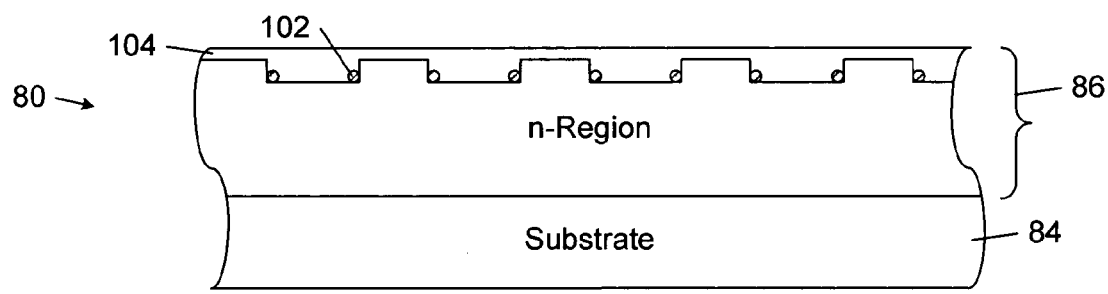
FIG. 16 is a diagrammatic sectional view of an epitaxial n-layer formed on the material that was deposited on the semiconductor device structure in accordance with the invention shown in FIG. 15A.

FIG. 16 shows an epitaxial n-layer 104 that is formed on the material 102 that was deposited on the semiconductor device structure 80. In some embodiments in accordance with the invention, the epitaxial n-layer 104 is formed of the same Group IV semiconductor as the underlying portions of the n-region 86. In other embodiments in accordance with the invention, the epitaxial n-layer 104 is formed of a different Group IV semiconductor that may be epitaxially grown on the underlying portions of the n-region 86. The epitaxial n-layer 104 completes the n-region 86 and embeds the deposited material 102 within the crystal lattice of the n-region 86. In this structure, the deposited material 102 forms an array 106 of local crystal modifications that induce overlapping, bandgap-increasing strain fields in the first Group IV semiconductor and improve crystal purity and quality in nearby regions.

Figure 17:
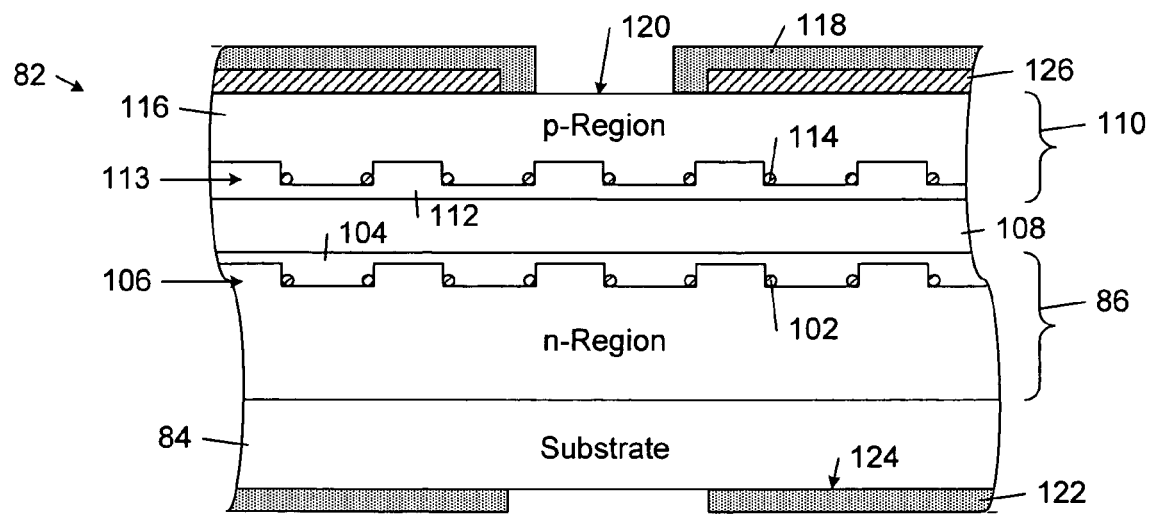
FIG. 17 a diagrammatic sectional view of a p-region, with an embedded array of local crystal modifications, and top and bottom electrodes formed on the n-region of the semiconductor device structure in accordance with the invention shown in FIG. 16.

FIG. 17 shows an intrinsic or lightly-doped intermediate region 108 and a p-region 110 formed on the completed n-region 86. The intermediate region 108 corresponds to an epitaxial Group IV semiconductor layer that is grown on the n-type epitaxial layer 104. In the illustrated embodiment in accordance with the invention, the p-region 50 corresponds to a p-type epitaxial layer that is grown on the intermediate region 108. In other embodiments in accordance with the invention, the p-region 110 corresponds to a volume of the intermediate region 108 that is doped p-type. The p-region 110 includes a p-type epitaxial layer 112, which includes a relief pattern that controls the growth of a material 114, which results in the formation of an array 113 of local crystal modifications 114 that induces overlapping, bandgap-increasing strain fields in the second Group IV semiconductor. The relief pattern and the array 113 of local crystal modifications may be formed in the same way as the corresponding structures in the n-region 86.

The p-region 110 includes a top p-type epitaxial layer 116 that completes the p-region 110 and embeds the deposited material 114 within the crystal lattice of the p-region 110. In some embodiments in accordance with the invention, the epitaxial p-layer 116 is formed of the same Group IV semiconductor as the underlying portions of the p-region 110. In other embodiments in accordance with the invention, the epitaxial p-layer 116 is formed of a different Group IV semiconductor that may be epitaxially grown on the underlying portions of the p-region 110.

FIG. 17 additionally shows a top ohmic electrical contact 118 on a top surface 120 of the semiconductor device 82 and a bottom ohmic electrical contact 122 on a bottom surface 124 of the substrate 84. A portion of the top electrical contact 118 is electrically isolated from the p-region 110 by a layer 126 of electrically insulating material (e.g., silicon dioxide or silicon nitride).

The top electrical contact 118 may connect the p-region 110 to a source of a forward bias and the bottom electrical contact 122 may connect the n-region 86 to ground potential. In response to an applied forward bias, electrons and holes are injected into the accumulation region where they are confined by the energy barriers created by the first and second arrays 106, 113 of local crystal modifications. The injected carriers recombine in the charge accumulation region. The light that is generated by the recombining holes and electrons may be emitted, for example, through the top surface 120 or the bottom surface 124.

Figure 18:
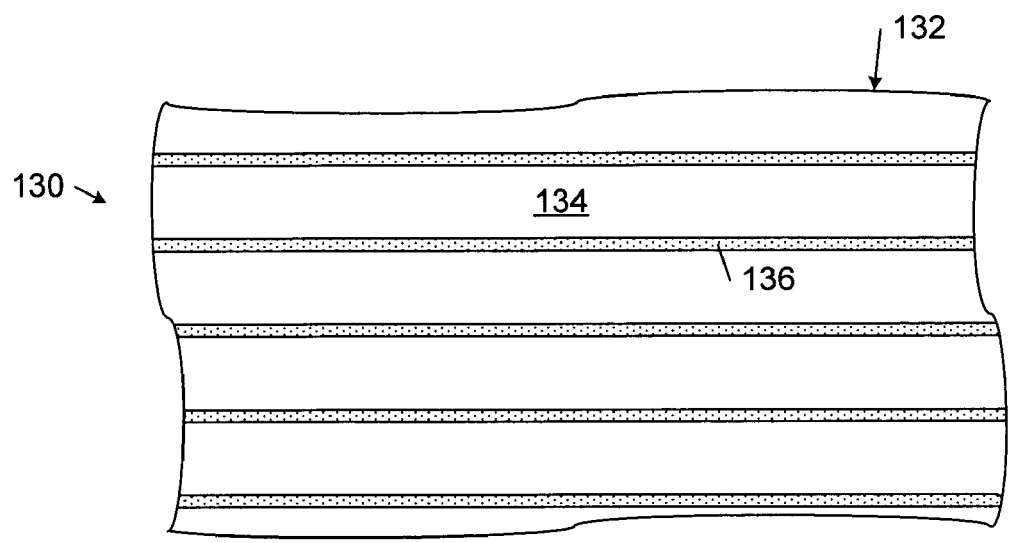
FIG. 18 is a diagrammatic top view of an embodiment in accordance with the invention of a semiconductor device structure than includes an array of parallel relief structures and deposited material arranged in a linear array.
Figure 19A:
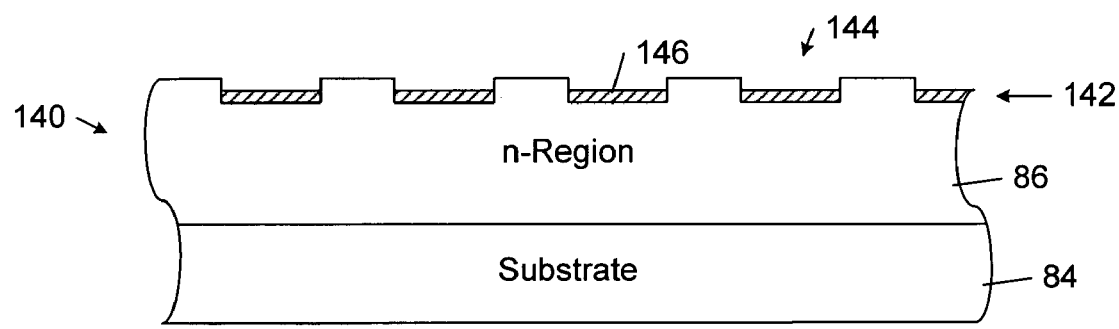
FIGS. 19A and 19B respectively are a diagrammatic sectional view and a diagrammatic top view of an embodiment in accordance with the invention of a semiconductor device structure than includes a relief pattern and an array of strain layer regions formed in accordance with the relief pattern.
Figure 19B:
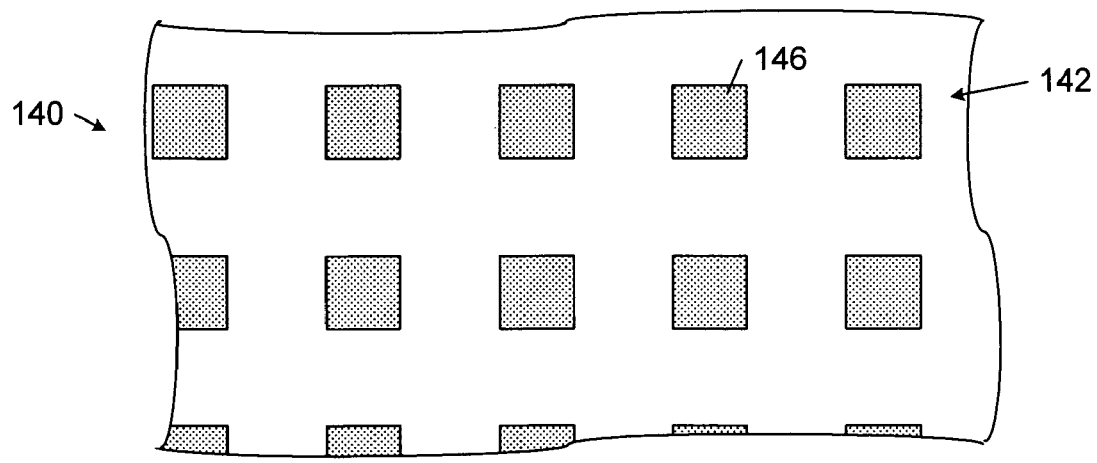

In the embodiment in accordance with the invention illustrated in FIG. 15B, the relief pattern 94 includes a periodic array of repeating unit cells 128 each having an identical relief pattern. The deposited material 102 forms a planar array of loops on the exposed surfaces of the n-region 86. In other embodiments in accordance with the invention, the relief pattern 94 may be configured to promote the growth of the deposited material 102 in the form of other one-dimensional, two-dimensional or three-dimensional shapes, such as lines, curves, circles, ellipses, polygons, and blobs. For example, FIG. 18 shows an embodiment in accordance with the invention of a semiconductor device structure 130 that includes a relief structure 132 consisting of a series of parallel, elongate terraces 134. In this embodiment in accordance with the invention, the deposited material 136 forms a series of parallel lines along the steps of the terraces 134. FIGS. 19A and 19B respectively show sectional and top views of an embodiment in accordance with the invention of a semiconductor device structure 140 that includes a relief structure 142 consisting of a regular array of square pits 144. In this embodiment, the deposited material 146 forms a regular periodical array of square thin film regions or patches in the pits 144.

Other embodiments in accordance with the invention are within the scope of the claims.

For example, in the embodiments in accordance with the invention described above, the p-regions are located above the n-regions. In other embodiments in accordance with the invention, the n-regions may be located above the p-regions. In addition, the top n- and p-regions may be epitaxially grown with a selected dopant profile rather than being formed by an implanted dopant profile, as shown in the illustrated embodiments.

Some embodiments in accordance with the invention may incorporate Group IV element nanostructures in the charge accumulation regions of respective ones of the above-described semiconductor device embodiments.

Figure 20:
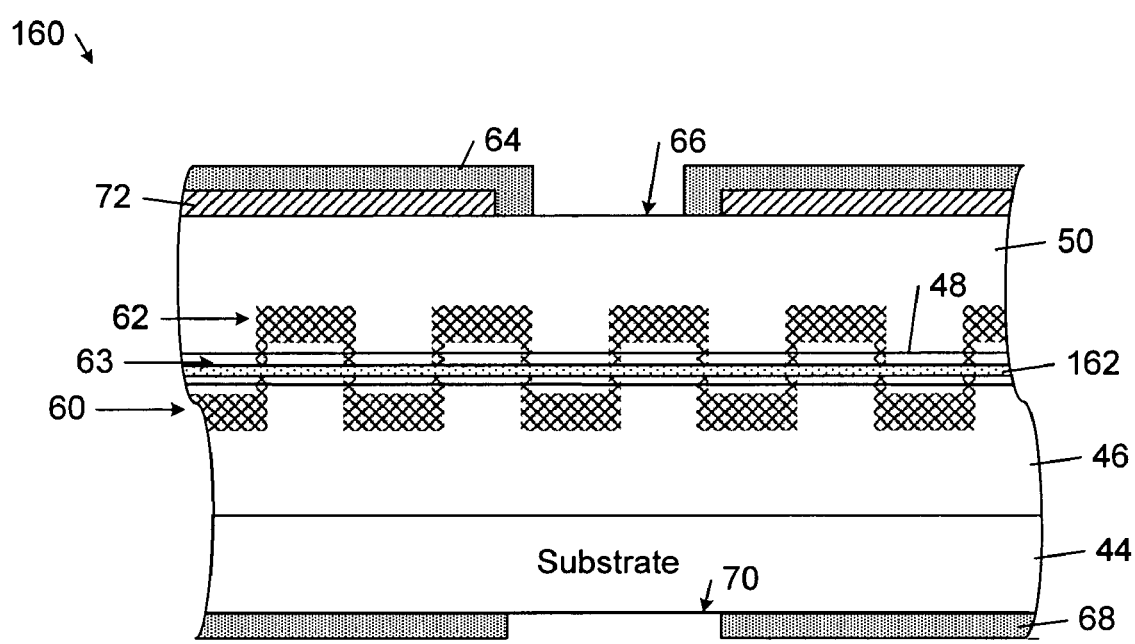
FIG. 20 is a diagrammatic sectional view of an embodiment in accordance with the invention of the semiconductor device embodiment shown in FIG. 1.

FIG. 20 shows an embodiment in accordance with the invention of a semiconductor device 160 that corresponds to an embodiment in accordance with the invention of the semiconductor device 10. The semiconductor device 160 includes Group IV element nanostructures 162 that are embedded in the material of the intermediate epitaxial region 48 in the embodiment shown in FIG. 11. The Group IV element nanostructures may be, for example, quantum dots that are formed of Ge or Si/Sn.

In some embodiments in accordance with the invention, Ge quantum dots are formed as follows. First, a monolayer of Sb is deposited as a wetting layer, then a four-monolayer Si/four-monolayer Ge superlattice grown at a temperature of 550° C. The superlattice has 4 periods, followed by a 5 nm Si layer and then four more superlattice periods. In some of these embodiments in accordance with the invention, the resulting superlattice self-organizes into Ge quantum dots. In other ones of these embodiments in accordance with the invention, the superlattice is annealed during growth to form Ge quantum dots.

In other embodiments in accordance with the invention, Ge quantum dots are formed by growing Ge on Si. The Ge initially wets the Si surface and grows planar layers up to three monolayers at which point the Ge starts forming islands. These islands are capped with a silicon layer to form the Ge quantum dots.

In some embodiments in accordance with the invention, Si/Sn quantum dots are formed as follows. At a low temperature (e.g., below 400° C.), very thin (e.g., 1-4 nm thick) SiSn alloy layers are grown on Si. Si is grown on the alloy layers to embed the SiSn alloy layers in silicon. The alloy layers are annealed to form Si/Sn quantum dots embedded in silicon.

What is claimed is:

1. A semiconductor device, comprising:
   a first region comprising a first Group IV semiconductor having a bandgap and doped with a first dopant of a first electrical conductivity type;
   a second region comprising a second Group IV semiconductor having a bandgap and doped with a second dopant of a second electrical conductivity type opposite the first conductivity type;
   a first regular array of spaced-apart local crystal modifications in the first region and inducing in the first Group IV semiconductor overlapping strain fields that increase the bandgap of the first Group IV semiconductor and create an energy band barrier against transport of minority carriers across the first region; and
   a second regular array of spaced-apart local crystal modifications in the second region and inducing in the second Group IV semiconductor overlapping strain fields that increase the bandgap of the second Group IV semiconductor and create an energy band barrier against transport of minority carriers across the second region.

2. The device of claim 1, wherein the first and second arrays are interleaved such that ones of the local crystal modifications in the first array are disposed over respective spaces between adjacent ones of the local crystal modifications in the second array.

3. The device of claim 2, further comprising a third array of spaced-apart local crystal modifications between ones of the local crystal modifications in the first array and corresponding ones of the local crystal modifications in the second array.

4. The device of claim 1, wherein the first Group IV semiconductor is doped with the first dopant at a concentration of at least $1 \times 10^{18}$ cm$^{-3}$ at the first array and the second Group IV semiconductor is doped with the second dopant at a concentration of at least $1\times10^{18}$ cm$^{-3}$ at the second array.

5. The device of claim 1, wherein the local crystal modifications in the first and second arrays are defects.

6. The device of claim 5, wherein adjacent ones of the local crystal modifications in the first and second arrays are spaced apart by distances of at most 200 nm.

7. The device of claim 1, wherein the local crystal modifications in at least one of the first and second arrays are embedded in a patterned region of the corresponding Group IV semiconductor.

8. The device of claim 1, wherein, in response to an applied forward bias, majority carriers from the first and second regions radiatively recombine in a charge accumulation region between the first and second minority carrier barriers.

9. The device of claim 1, further comprising nanostructures formed of Group IV semiconductor atoms and embedded between the first and second regular arrays of spaced-apart local crystal modifications.

10. The device of claim 1, wherein the first region additionally comprises a relief structure.

11. The device of claim 10, wherein the local crystal modifications are embedded in the first region adjacent to features of the relief structure.

12. The device of claim 11, wherein the relief structure comprises an array of mesas separated by channels, and the local crystal modifications are in corners formed at interfaces between the mesas and the channels.

13. The device of claim 11, wherein the relief structure comprises an array of pits, and the local crystal modifications are disposed in the pits as spaced-apart thin film regions of material.

14. A semiconductor device, comprising:
   a first region comprising a first Group IV semiconductor having a bandgap and doped with a first dopant of a first electrical conductivity type, wherein the first region additionally comprises a relief structure;
   a second region comprising a second Group IV semiconductor having a bandgap and doped with a second dopant of a second electrical conductivity type opposite the first conductivity type; and
   an array of spaced-apart local crystal modifications in the first region and inducing in the first Group IV semiconductor overlapping strain fields that increase the bandgap of the first Group IV semiconductor and create an energy band barrier against transport of minority carriers across the first region, wherein the local crystal modifications are embedded in the first region adjacent to features of the relief structure.

15. The device of claim 14, wherein the array comprises a series of repeating unit cells each comprising at least one of the local crystal modifications.

16. The device of claim 14, wherein the local crystal modifications comprise material different from the first Group IV semiconductor.

17. The device of claim 16, wherein constituent atoms of the local crystal modifications are different in size than constituent atoms of the first Group IV semiconductor.

18. The device of claim 16, wherein constituent atoms of the local crystal modifications have different electronegativities than constituent atoms of the first Group IV semiconductor.

19. The device of claim 16, wherein the local crystal modifications correspond to strained semiconductor layers.

20. The device of claim 14, wherein at the array of spaced-apart local crystal modifications the first Group IV semiconductor is doped with the first dopant at a concentration of at least $1\times10^{18}$ cm$^{-3}$.

21. The device of claim 14, wherein the array of local crystal modifications is embedded in dislocation-free regions of the first Group IV semiconductor.

22. The device of claim 14, wherein, in response to an applied forward bias, majority carriers from the first and second regions radiatively recombine in a charge accumulation region between the first and second minority carrier barriers.

23. The device of claim 14, further comprising nanostructures formed of Group IV semiconductor atoms and embedded in an active light-emitting region of the device.

24. The device of claim 14, wherein the relief structure comprises an array of mesas separated by channels, and the local crystal modifications are in corners formed at interfaces between the mesas and the channels.

25. The device of claim 14, wherein the relief structure comprises an array of pits, and the local crystal modifications are disposed in the pits as spaced-apart thin film regions of material.

* * * * *